(12) United States Patent
Tzu

(10) Patent No.: US 7,274,098 B2
(45) Date of Patent: Sep. 25, 2007

(54) CHIP PACKAGING STRUCTURE WITHOUT LEADFRAME

(75) Inventor: Chung-Hsing Tzu, Zhonghe (TW)

(73) Assignee: Domintech Co., Ltd. (TW)

( * ) Notice: Subject to any disclaimer, the term of this patent is extended or adjusted under 35 U.S.C. 154(b) by 82 days.

(21) Appl. No.: 11/195,655

(22) Filed: Aug. 3, 2005

(65) Prior Publication Data

US 2007/0029680 A1  Feb. 8, 2007

(51) Int. Cl.
*H01L 29/40* (2006.01)
*H01L 23/48* (2006.01)
*H01L 23/52* (2006.01)

(52) U.S. Cl. ............... 257/690; 257/737; 257/784; 257/786; 257/E23.068

(58) Field of Classification Search ........... 257/701, 257/690, 737, 784, 786
See application file for complete search history.

(56) References Cited

U.S. PATENT DOCUMENTS 5,990,546 A * 11/1999 Igarashi et al. ............ 257/700
6,181,569 B1 * 1/2001 Chakravorty ............... 361/761

* cited by examiner

*Primary Examiner*—Nitin Parekh

(57) ABSTRACT

A chip packaging structure without leadframe includes a bare chip having one surface provided with a plurality of contacts, and an adhesive and a fixing layer sequentially attached to the surface of the bare chip with the contacts, and a plurality of lead wires sandwiched between the adhesive and the fixing layer. Each of the lead wires has an inner end electrically connected to one of the contacts on the bare chip via an inner connecting window area provided on the adhesive layer corresponding to the contacts on the bare chip, and an outer end extended to one of multiple outer connecting window areas provided on the fixing layer to electrically connect to one of many external conducting bodies implanted in and exposed from the outer connecting window areas, such that no leadframe is needed to enable further reduced volume and decreased packaging cost of the whole chip packaging structure.

7 Claims, 6 Drawing Sheets

CHIP PACKAGING STRUCTURE WITHOUT LEADFRAME

FIELD OF THE INVENTION

The present invention relates to a chip packaging structure, and more particularly to a chip packaging structure without leadframe that is sufficient for using with other electronic products, such as a circuit board.

BACKGROUND OF THE INVENTION

FIG. 10 shows a conventional chip packaging structure that includes a metal leadframe 10, which is pressed at two opposite lateral sides or all four sides to form a plurality of strip-like leads 101 arranged in a predetermined manner. Each of the leads 101 is further pressed at a predetermined position to form a downward projection 102, a lower end surface 103 of which serves to electrically contact with external elements. An adhesive tape 20 is attached to a top of the leads 101 of the leadframe 10, and a semiconductor chip 30 is fixedly mounted on the adhesive tape 20. The chip 30 is electrically connected to each of the leads 101 via a metal wire 40, and an insulating sealing material 50 is applied to seal all outer surfaces of the chip 30 and a bottom side of the leadframe 10 to expose only the lower end surfaces 103 of the leads 101 for electrically connecting to external elements, such as a circuit board.

The above-described conventional chip packaging structure is a technique being widely employed in current chip packaging. However, it requires complicate and troublesome pressing and forming process before packaging the leadframe 10 and the chip 30. It is more difficult to accurately control the process and the quality of the leadframe 10 in the above-described chip packaging technique when the chip 30 is kept reduced in volume, and the cost for quality control is inevitably increased under this circumstance. The leadframe 10 also has adverse influences on the miniaturization of the whole chip packaging structure. Moreover, the sealing material 50 used to seal the chip 30 and the leadframe 10 after the metal wires 40 have been soldered to the chip 30 and the leads 101 frequently damages the metal wires 40 or contacts thereof in the process of applying the sealing material 50, resulting in many defects in the completed chip packaging structure, and accordingly costs in subsequent quality test and control.

It is therefore tried by the inventor to develop a chip packaging structure without leadframe to overcome the drawbacks existed in the conventional chip packaging techniques.

SUMMARY OF THE INVENTION

A primary object of the present invention is to provide a chip packaging structure without leadframe in which special arrangement and connection of lead wires is utilized to enable omission of the conventional leadframe from the chip package and accordingly reduced volume of the whole chip packaging structure, upgraded packaging quality, and reduced packaging cost.

To achieve the above and other objects, the chip packaging structure without leadframe according to the present invention mainly includes a bare chip having one surface provided with a plurality of contacts, and an adhesive and a fixing layer sequentially attached to the surface of the bare chip having the contacts provided thereon, and a plurality of lead wires sandwiched between the adhesive and the fixing layer. Each of the lead wires has an inner end electrically connected to one of the contacts on the bare chip via an inner connecting window area provided on the adhesive layer corresponding to the contacts on the bare chip, and an outer end extended to one of multiple outer connecting window areas provided on the fixing layer to electrically connect to one of many external conducting bodies implanted in and exposed from the outer connecting window areas, such that no leadframe is needed to enable further reduced volume and decreased packaging cost of the whole chip packaging structure.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
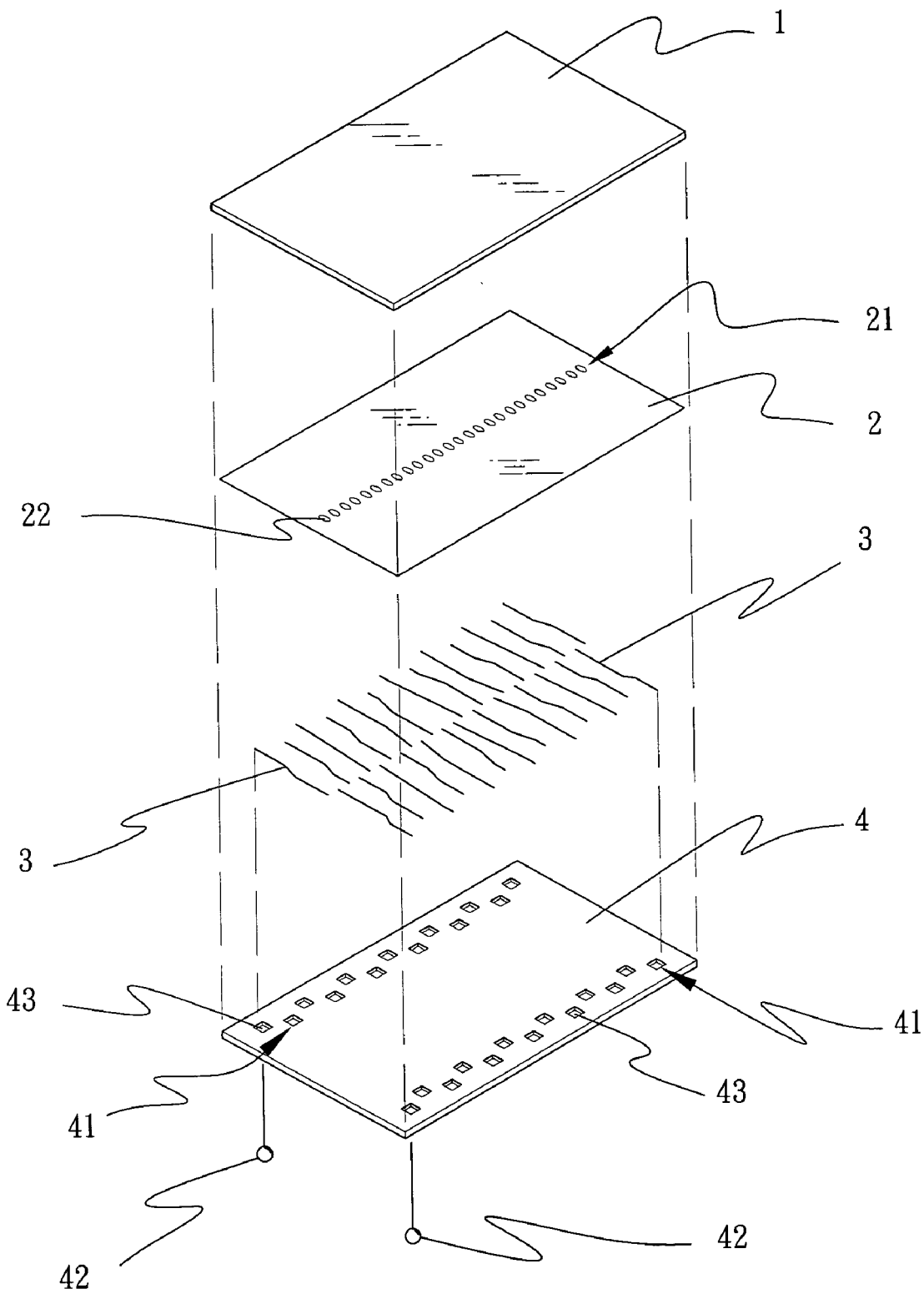
FIG. 1 is an exploded perspective view of a chip packaging structure without leadframe according to a first embodiment of the present invention.
Figure 2:
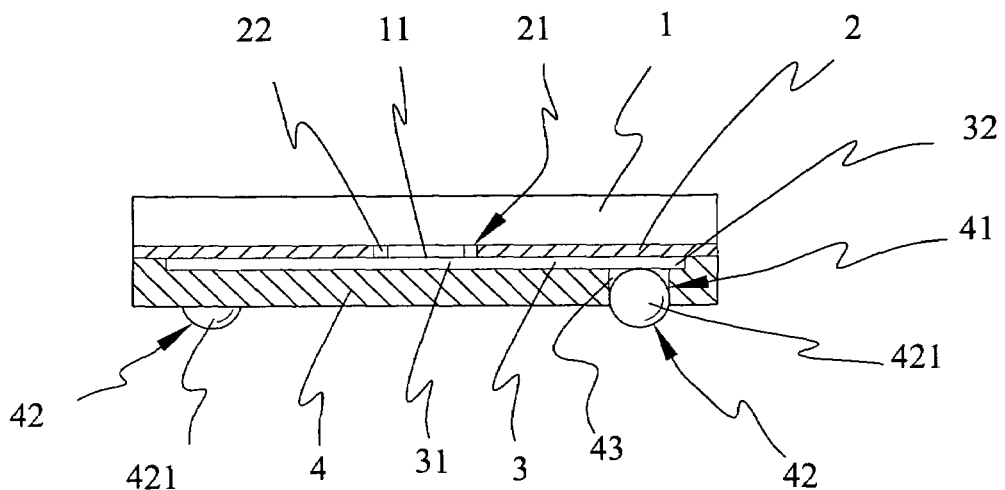
FIG. 2 is a sectioned side view of the chip packaging structure of FIG. 1.

Please refer to FIGS. 1 and 2 that are exploded perspective and sectioned side views, respectively, of a chip packaging structure without leadframe according to a first embodiment of the present invention. As shown, the chip packaging structure mainly includes a bare chip 1, an adhesive layer 2, a plurality of lead wires 3, and a fixing layer 4.

The bare chip 1 is an item made with a known technique. That is, the bare chip 1 is a cut sheet-shaped electronic element made of typical semiconductor materials, and has the functions of logic operation, memory, etc. The bare chip 1 is provided on at least one selected surface with a plurality of contacts 11 (see FIG. 2), via which the chip 1 is electrically connected to other electronic products.

The adhesive layer 2 is made of an adhesive film, and includes an inner connecting window area 21 corresponding to the contacts 11 on the bare chip 1 for the lead wires 3 to assemble thereto. The inner connecting window area 21 may include, for example, a plurality of independent through holes 22 or a long slot corresponding to the contacts 11. In the case of through holes 22, the holes may be rectangular, round, and the like without being limited to any specific shape.

The lead wires 3 are electrically conducting wires, such as metal wires, enabling the bare chip 1 to electrically connect to external items. Each of the lead wires 3 has an inner end 31 electrically connected to the contact 11 of the bare chip 1, and an outer end 32 electrically connected to external items.

Figure 9:
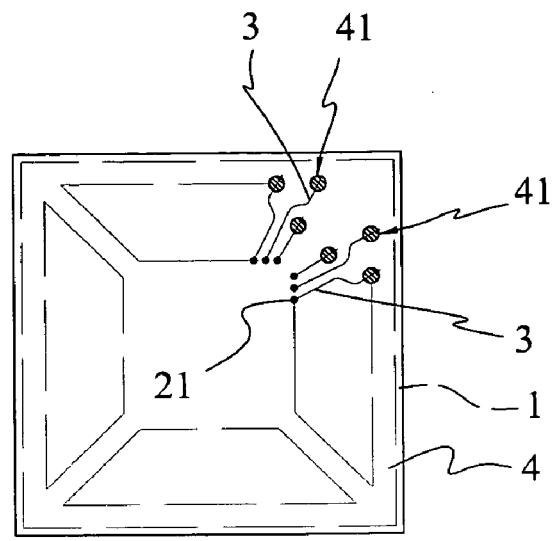
FIG. 9 shows another manner of arranging outer connecting window areas on a fixing layer of the chip packaging structure of the present invention.
Figure 10:
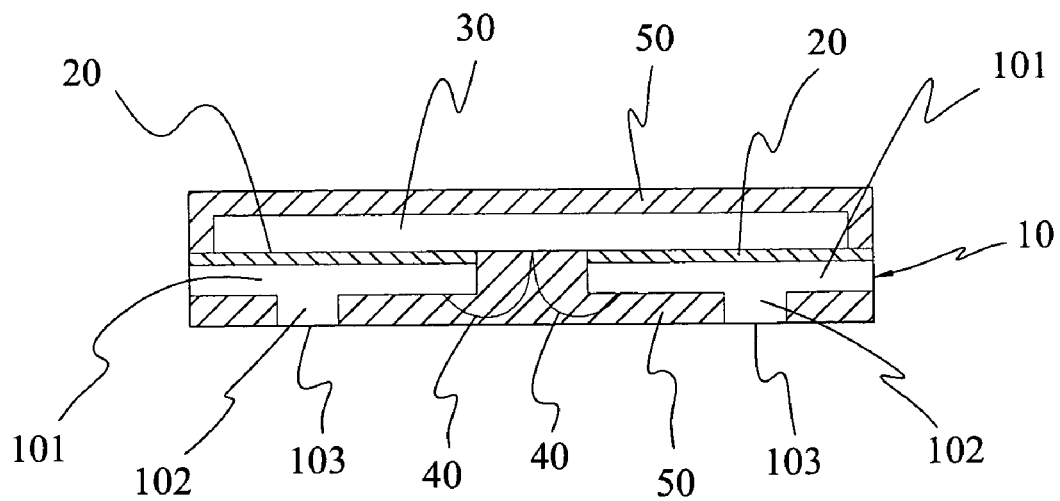
FIG. 10 is a sectional view of a conventional chip packaging structure.

The fixing layer 4 is provided at predetermined positions with outer connecting window areas 41, to which outer ends 32 of the lead wires 3 are assembled. In the outer connecting window areas 41, there are implanted external conducting bodies 42 to electrically connect to the outer ends of the lead wire 3 assembled to the outer connecting window areas 41. The outer connecting window areas 41 may include, for example, a plurality of independent through holes 43 or long slots. In the case of through holes 43, the holes may be rectangular, round, and the like. Moreover, the outer connecting window areas 41 may be provided on the fixing layer 4 at two opposite lateral sides thereof, as shown in FIG. 1, or at all four sides thereof like a matrix, as shown in FIG. 9.

Figure 3:
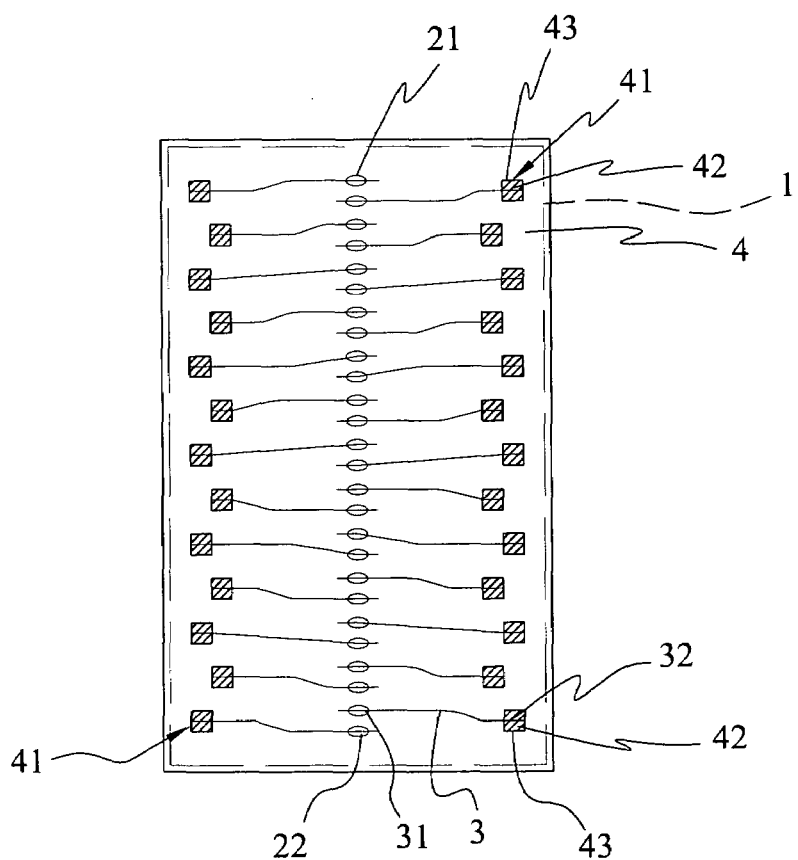
FIG. 3 is a sectioned plan view of the chip packaging structure of FIG. 1.

Please refer to FIGS. 2 and 3 that are sectioned side view and plan view, respectively, of the chip packaging structure without leadframe of FIG. 1. As shown, the adhesive layer 2, the lead wires 3, and the fixing layer 4 are sequentially attached to the surface of the bare chip 1 having the contacts 11 provided thereon, so that the lead wires 3 are firmly sandwiched between the adhesive layer 2 and the fixing layer 4 with the inner ends 31 of the lead wires 3 electrically connected to the contacts 11 on the bare chip 1 via the inner connecting window area 21 on the adhesive layer 2, and the outer ends 32 of the lead wires 3 extended to the outer connecting window areas 41 on the fixing layer 4 to electrically connect to the external conducting bodies 42 implanted in and exposed from the outer connecting window areas 41.

Figure 4:
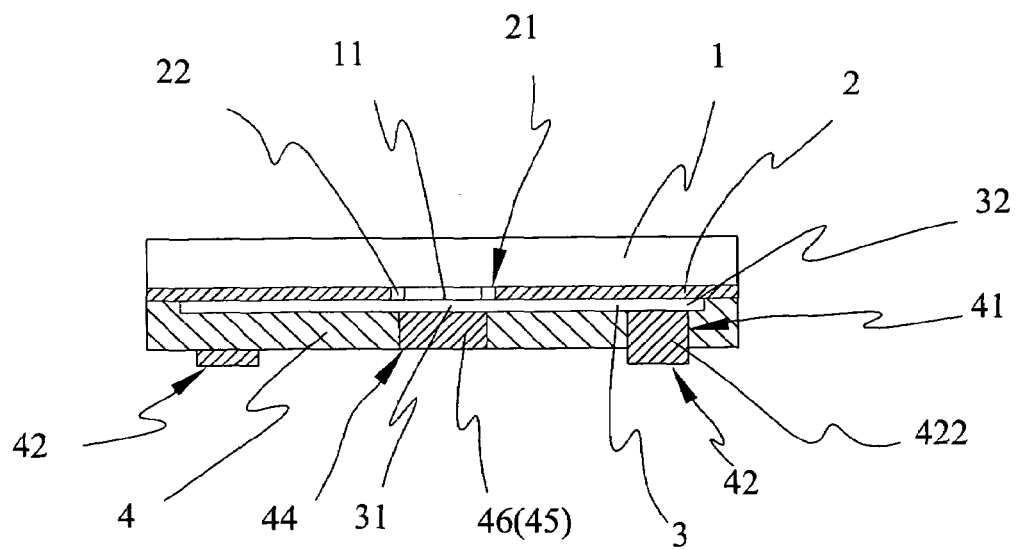
FIG. 4 is a sectioned side view of a chip packaging structure without leadframe according to a second embodiment of the present invention.

The external conducting bodies 42 implanted in the outer connecting window areas 41 for electrically connecting to the outer ends 32 of the lead wires 3 may be, for example, solder balls 421 firmly implanted in the outer connecting window areas 41, as shown in FIG. 2, or a type of solder paste 422 poured into the outer connecting window areas 41, as shown in FIG. 4, or any other conducting material, such as a copper block, suitable for implanting in the outer connecting window areas 41 to, on the one hand, electrically connect to the outer ends 32 of the lead wires 3 and, on the other hand, electrically connect to external electronic products, such as a circuit board.

Figure 5:
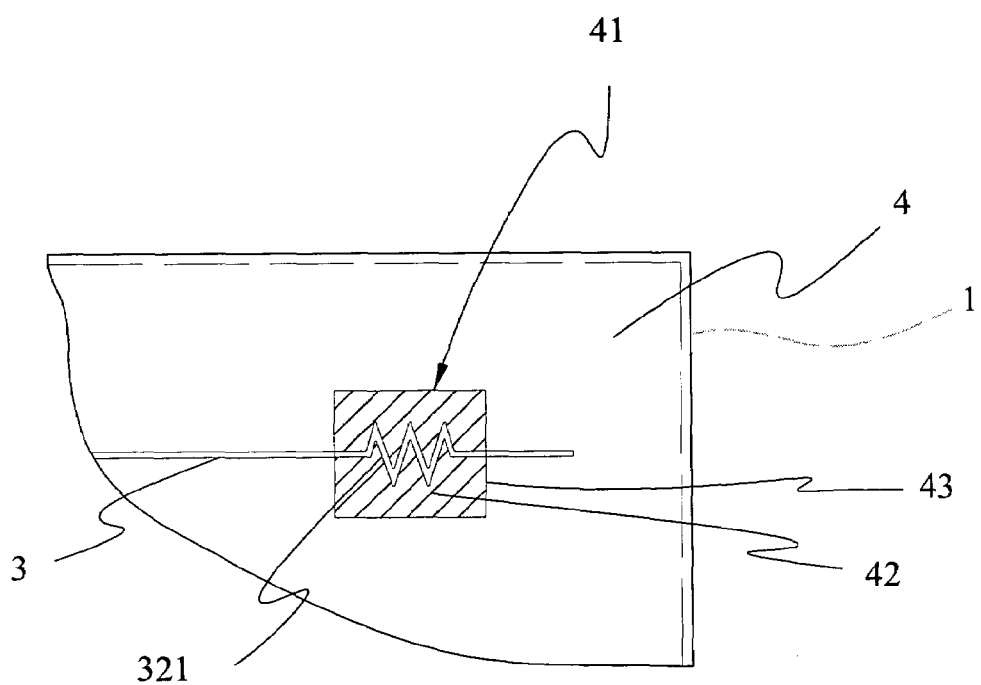
FIG. 5 shows a connecting section provided at an outer end of each lead wire in the chip packaging structure of the present invention.

Please refer to FIG. 5. The outer end 32 of the lead wire 3 may include a connecting section 321, at where the lead wire 3 is connected to the external conducting body 42. The connecting section 321 at the outer end of the lead wire 3 is bent to include a plurality of continuous sharp or other differently shaped turns, so as to enable the outer end 32 of the lead wire 3 to securely associate with the external conducting body 42 and to increase the contact area between the lead wire 3 and the external conducting body 42.

Figure 6:
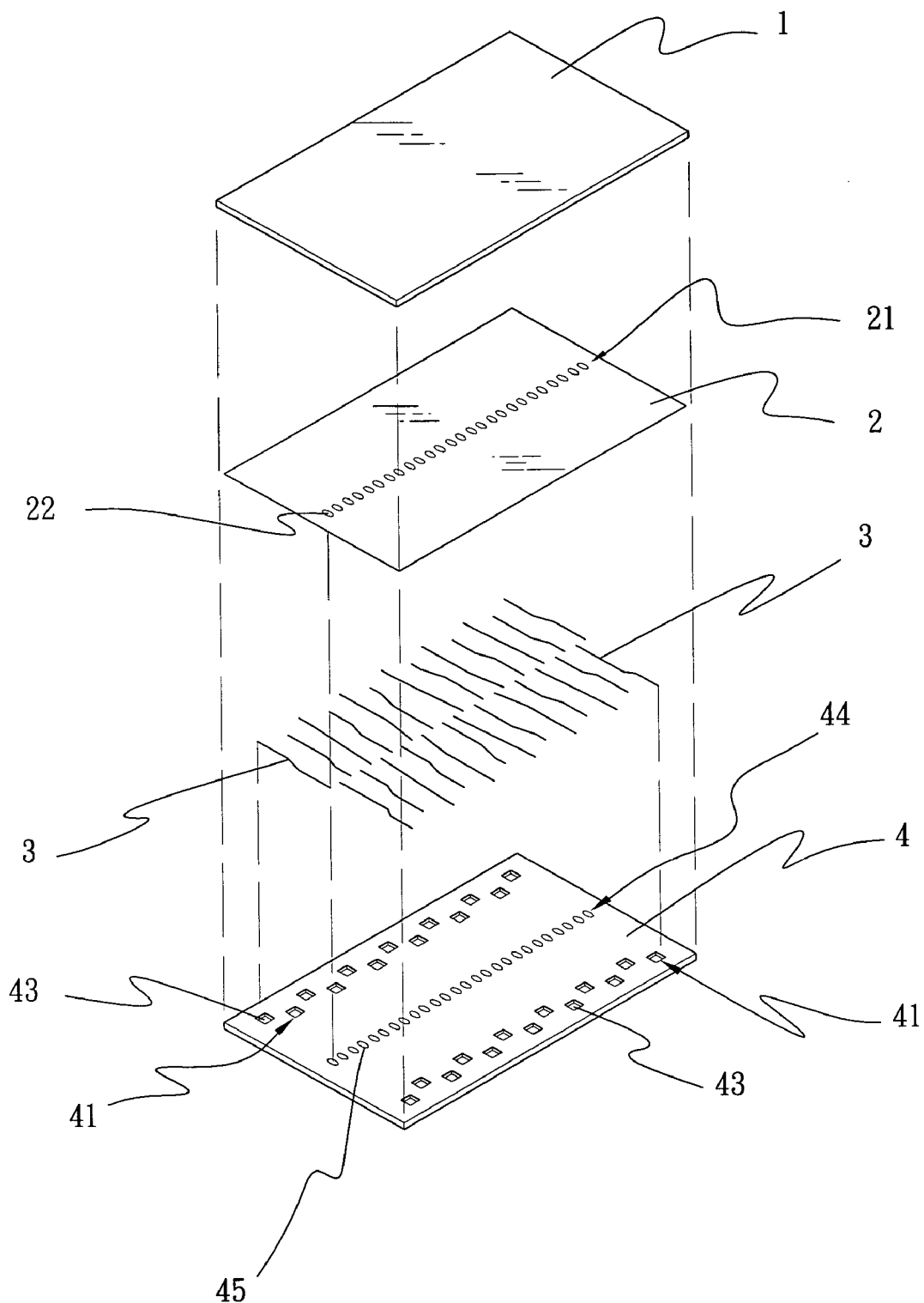
FIG. 6 is an exploded perspective view of a chip packaging structure without leadframe according to the second embodiment of the present invention.

Please refer to FIGS. 4 and 6 that are sectioned side view and exploded perspective view, respectively, of a chip packaging structure without leadframe according to a second embodiment of the present invention. The second embodiment is generally structurally similar to the first embodiment, except that the fixing layer 4 in the second embodiment is provided with an inner connecting window area 44 corresponding to the inner connecting window area 21 on the adhesive layer 2. The inner connecting window area 44 may include, for example, a plurality of independent through holes 45 or a long slot. Solder paste 46 is poured into the inner connecting window areas 21, 44 to allow the inner ends 31 of the lead wires 3 to firmly electrically connect to the contacts 11 on the bare chip 1.

Figure 7:
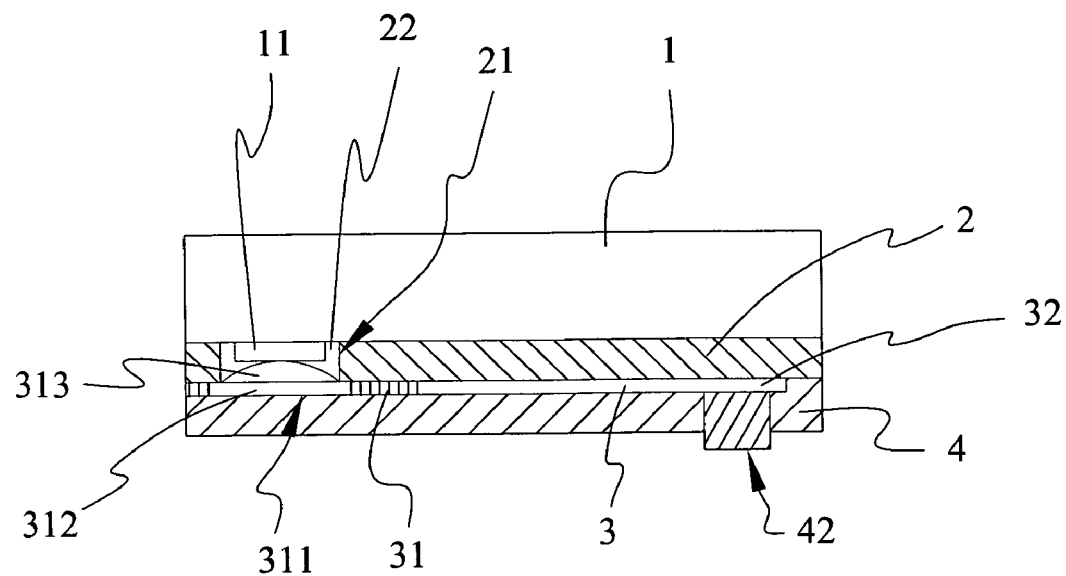
FIG. 7 is a sectioned side view showing a connecting section provided at an inner end of the lead wire in the chip packaging structure of the present invention.
Figure 8:
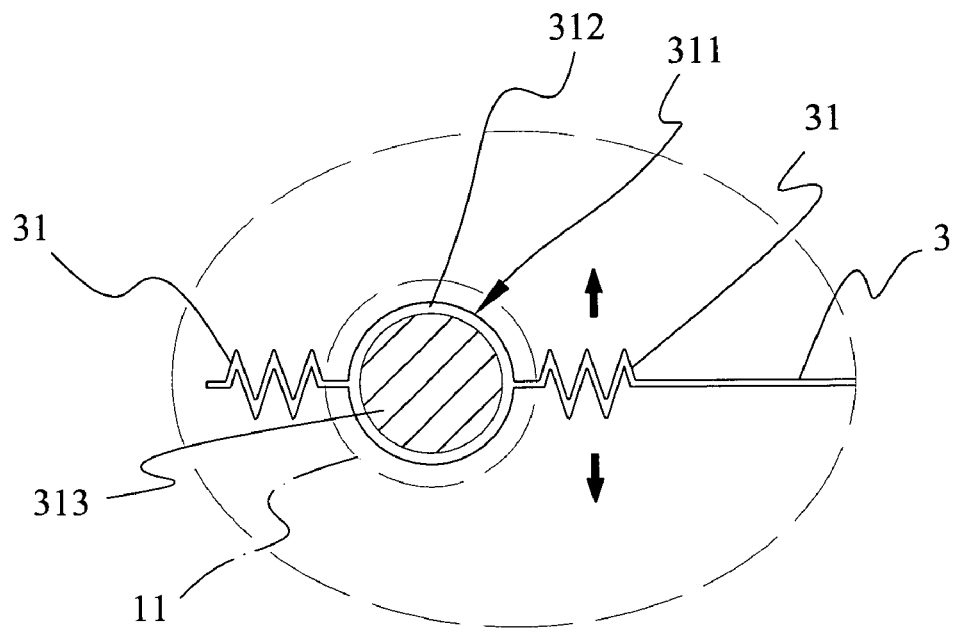
FIG. 8 is a fragmentary and enlarged plan view of the connecting section at the inner end of the lead wire in the chip packaging structure of the present invention.

Please refer to FIGS. 7 and 8 that are sectioned side view and enlarged plan view, respectively, showing a connecting section 311 provided at the inner end 31 of the lead wire 3. The connecting section 311 includes a plate portion 312 being connected at two opposite ends to the inner end 31 of the lead wires 3, and a metal block 313, such as a solder block, soldered to and protruded from a top of the plate portion 312. Moreover, the inner end 31 of the lead wire 3 is bent to include a plurality of continuous sharp turns. With the continuously bent inner end 31 of the lead wire 3, the plate portion 312 of the connecting section 311 may be moved to finely adjust its position to accurately align with and electrically connect to the contact 11 on the bare chip 1. The provision of the metal block 313 further ensures an accurate contact of the connecting section 311 with the contact 11 on the bare chip 1.

The chip packaging structure without leadframe according to the present invention has at least the following advantages:

1. The conventional leadframe is omitted to avoid the difficulties in accurately controlling the manufacturing process and the quality of the leadframe, and the material and quality control costs for the leadframe is saved.
2. The chip packaging structure without the leadframe may have further reduced volume to meet the compact requirement of current electronic products.
3. The lead wires 3 may be adhered to the adhesive layer 2 or the fixing layer 4 in advance before the fixing layer 4 is attached to the adhesive layer 2 to sandwich the lead wires 3 between them. In this manner, the lead wires 3 are not subjected to any pressure or impact as would in the conventional chip packaging technique when the sealing material is applied to seal the chip and the leadframe. The good yield of the complete chip packaging structure can therefore be effectively increased and the subsequent cost for quality control can be reduced.

What is claimed is:

1. A chip packaging structure without leadframe, comprising:
    a bare chip being provided on at least a predetermined surface with a plurality of contacts;
    an adhesive layer being provided with an inner connecting window area corresponding to said contacts on said bare chip;
    a plurality of lead wires, each of which has an inner and an outer end; and
    a fixing layer being provided at predetermined positions with outer connecting window areas, in which external conducting bodies are implanted; and
    said adhesive layer, said lead wires, and said fixing layer being sequentially assembled to said predetermined surface of said bare chip having said contacts provided thereon, such that said lead wires are sandwiched between said adhesive and said fixing layer with said inner ends of said lead wires electrically connected to said contacts on said bare chip via said inner connecting window area on said adhesive layer, and said outer ends of said lead wires extended to said outer connecting window areas on said fixing layer to electrically connect to said external conducting bodies implanted in said outer connecting window areas, each said outer end of said lead wires being formed in a planar undulating contour for increasing a contact area with a corresponding one of said external conducting bodies.

2. The chip packaging structure without leadframe as claimed in claim 1, wherein said inner connecting window area on said adhesive layer includes a plurality of independent through holes or a long slot corresponding to said contacts on said bare chip.

3. The chip packaging structure without leadframe as claimed in claim 1, wherein said outer connecting window areas on said fixing layer include a plurality of independent through holes or long slots.

4. The chip packaging structure without leadframe as claimed in claim 1, wherein said outer connecting window areas on said fixing layer are located at two opposite lateral sides of said fixing layer.

5. The chip packaging structure without leadframe as claimed in claim 1, wherein said fixing layer is provide with an inner connecting window area corresponding to said inner connected window area on said adhesive, and a predetermined type of solder paste being poured into said inner connecting windows areas on said fixing layer.

6. The chip packaging structure without leadframe as claimed in claim 1, wherein said outer ends of said lead wires include a connecting section each for electrically connecting to said external conducting bodies implanted in said outer connecting window areas on said fixing layer.

7. The chip packaging structure without leadframe as claimed in claim 1, wherein said external conducting bodies are selected from the group consisting of implanted solder balls and poured solder paste.

* * * * *